(12) United States Patent
Sardella et al.

(10) Patent No.: US 7,290,330 B2
(45) Date of Patent: Nov. 6, 2007

(54) COUPLING INVERTIBLE AND PLUGGABLE MODULE TO A CIRCUIT BOARD

(75) Inventors: Steven D. Sardella, Marlborough, MA (US); Stephen E. Strickland, Marlborough, MA (US); Bassem N. Bishay, Attleboro, MA (US); Thomas J. Connor, Jr., Winchendon, MA (US)

(73) Assignee: EMC Corporation, Hopkinton, MA (US)

( * ) Notice: Subject to any disclaimer, the term of this patent is extended or adjusted under 35 U.S.C. 154(b) by 143 days.

(21) Appl. No.: 11/114,761

(22) Filed: Apr. 26, 2005

(65) Prior Publication Data

US 2005/0186810 A1 Aug. 25, 2005

Related U.S. Application Data

(62) Division of application No. 10/608,745, filed on Jun. 27, 2003, now Pat. No. 6,924,986.

(51) Int. Cl.
 *H05K 3/30* (2006.01)
(52) U.S. Cl. .............................. 29/832; 29/831; 29/837; 29/842; 361/791; 439/541.5
(58) Field of Classification Search ................. 29/831, 29/832, 834, 837, 842; 361/748, 752, 753, 361/755, 785, 786, 788, 791, 796, 797, 875; 439/61, 65, 74, 76.1, 541.5, 629, 945, 947, 439/975
See application file for complete search history.

(56) References Cited

U.S. PATENT DOCUMENTS

| | | | | |
|---|---|---|---|---|
| 4,232,924 A | * | 11/1980 | Kline et al. .................... | 439/74 |
| 4,907,977 A | * | 3/1990 | Porter .......................... | 439/74 |
| 5,017,146 A | | 5/1991 | Uehara et al. ................. | 439/65 |
| 5,023,754 A | * | 6/1991 | Aug et al. .................... | 361/788 |
| 5,181,679 A | | 1/1993 | Frielinghaus et al. ... | 246/182 R |
| 5,233,502 A | | 8/1993 | Beatty et al. ................ | 361/681 |
| 5,305,182 A | | 4/1994 | Chen ........................... | 361/684 |
| 5,488,541 A | | 1/1996 | Mistry et al. ................ | 361/788 |
| 6,241,530 B1 | | 6/2001 | Eddy et al. ................... | 439/61 |
| 6,454,585 B1 | | 9/2002 | Homer et al. ............... | 439/218 |
| 6,457,978 B1 | | 10/2002 | Cloonan et al. .............. | 439/61 |
| 6,644,979 B2 | | 11/2003 | Huang .......................... | 439/65 |

\* cited by examiner

*Primary Examiner*—Minh Trinh
*Assistant Examiner*—Donghai D. Nguyen
(74) *Attorney, Agent, or Firm*—BainwoodHuang

(57) ABSTRACT

A system including a circuit board and several pluggable modules coupled to the circuit board. The several pluggable modules are insertable through side-by-side slots in an enclosure in which the circuit board resides. A first pluggable module is coupled to the circuit board via a first connector, while a second pluggable module is coupled to the circuit board via a second connector such that the second pluggable module is laterally offset from the first pluggable module. The first and second connectors are right angle connectors, and the second right angle connector is inverted relative to the first right angle connector. The first and second pluggable modules are I/O modules for transporting high speed differential signals, and wherein the first pluggable module includes several XFP connectors, and wherein the second pluggable module includes several SFP connectors. The second pluggable module includes several SFP connectors arranged on both sides of the pluggable module.

5 Claims, 14 Drawing Sheets

| GND | INVERTED _N | GND | SIGNAL A | GND | GND | SIGNAL C | GND | GND | GND | SIGNAL Y | GND | GND | DATA/ CLK_N | GND |
|---|---|---|---|---|---|---|---|---|---|---|---|---|---|---|
| | A0+ | | GND | | A4+ | GND | | | B7+ | GND | | B3+ | GND | |
| | A0- | | A2- | | A4- | A6- | | | B7- | B5- | | B3- | B1- | |
| | GND | | A2+ | | GND | A6+ | | | GND | B5+ | | GND | B1+ | |
| | A1+ | | GND | | A5+ | GND | | | B6+ | GND | | B2+ | GND | |
| | A1- | | A3- | | A5- | A7- | | | B6- | B4- | | B2- | B0- | |
| | GND | | A3+ | | GND | A7+ | | | GND | B4+ | | GND | B0+ | |
| | CLK/ DATA_N | | GND | | SIGNAL B | GND | | | SIGNAL W | GND | | SIGNAL Z | GND | |

FIG. 7

COUPLING INVERTIBLE AND PLUGGABLE MODULE TO A CIRCUIT BOARD

CROSS REFERENCE TO RELATED APPLICATIONS

This Patent Application is a Divisional of Application Ser. No. 10/608,745, now U.S. Pat. No. 6,924,986 filed on Jun. 27, 2003, entitled, "INVERTIBLE, PLUGGABLE MODULE FOR VARIABLE I/O DENSITIES", the contents and teachings of which are hereby incorporated by reference in their entirety.

FIELD OF THE INVENTION

The present invention relates generally to storage systems, and more particularly to a flexible architecture for providing variable I/O densities.

BACKGROUND OF THE INVENTION

A typical disk array may have one or more interfaces for communicating with a host server system, and one or more interfaces for communicating with the disk drives. The interfaces for communicating with the host might use any of various different host communication technologies, for example, 10 gigabit Ethernet or 10 gigabit Fibrechannel or ISCSI. The interfaces for communicating with the disks might use and of various storage channel technologies, for example, 2 Gigabit Fibrechannel or SATA. As storage technology improves, disk drives continue to become smaller and denser. Storage channel technologies continue to increase in speed, and new storage technologies are continually introduced. Storage systems therefore continue to be re-designed in order to take advantage of the smaller, denser drives and higher speed technologies to provide systems offering larger amounts of storage space that are more quickly accessible.

The disk array systems of today typically consist of a single board that contains control logic and I/O interface logic. Or, a system might include several boards containing control logic and I/O interface logic in a manner whereby the I/O interface logic cannot be changed once the system is manufactured. Thus, if a customer currently has a 2 Gigabit Fibrechannel interface, but wants to upgrade to a 10 Gigabit Fibrechannel interface, the entire chassis must be replaced. Furthermore, many different types of chassis must be manufactured—one for each possible combination of disk and host I/O interfaces.

It would be advantageous to provide a storage system architected such that a storage chassis could accept different types of I/O modules such that various technologies and I/O densities can be installed in a storage chassis.

SUMMARY OF THE INVENTION

In accordance with the principles of the invention, innovative apparatus and methods are employed to provide a highly flexible storage system. A system in accordance with the invention includes a circuit board and a plurality of pluggable modules coupled to the circuit board. The pluggable modules are insertable through side-by-side slots in an enclosure in which the circuit board resides. A first pluggable module is coupled to the circuit board via a first connector, while a second pluggable module is coupled to the circuit board via a second connector such that the second pluggable module is laterally offset from the first pluggable module.

According to an implementation, the first and second connectors are right angle connectors, and the second right angle connector is inverted relative to the first right angle connector.

According to an alternate implementation, a riser board is coupled to the circuit board. The riser board includes two rows of connectors. The first pluggable module is coupled to the circuit board via a first connector in the first of the two rows of connectors, while the second pluggable module is coupled to the circuit board via a second connector in the second of the two rows of connectors.

More particularly, the first and second pluggable modules are I/O modules for transporting high speed differential signals, and wherein the first pluggable module includes several XFP connectors, and wherein the second pluggable module includes several SFP connectors. The second pluggable module includes several SFP connectors arranged on both sides of the pluggable module.

The various aspects of the invention are advantageously employed to produce a storage system wherein many different types of I/O modules may be plugged in through slots in a storage enclosure and wherein different connector heights can be accommodated.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

FIG. 7 is a representation of a pinout for the right angle connectors on the XFP and SFP pluggable modules.

DETAILED DESCRIPTION OF EXEMPLARY EMBODIMENTS

Figure 1:
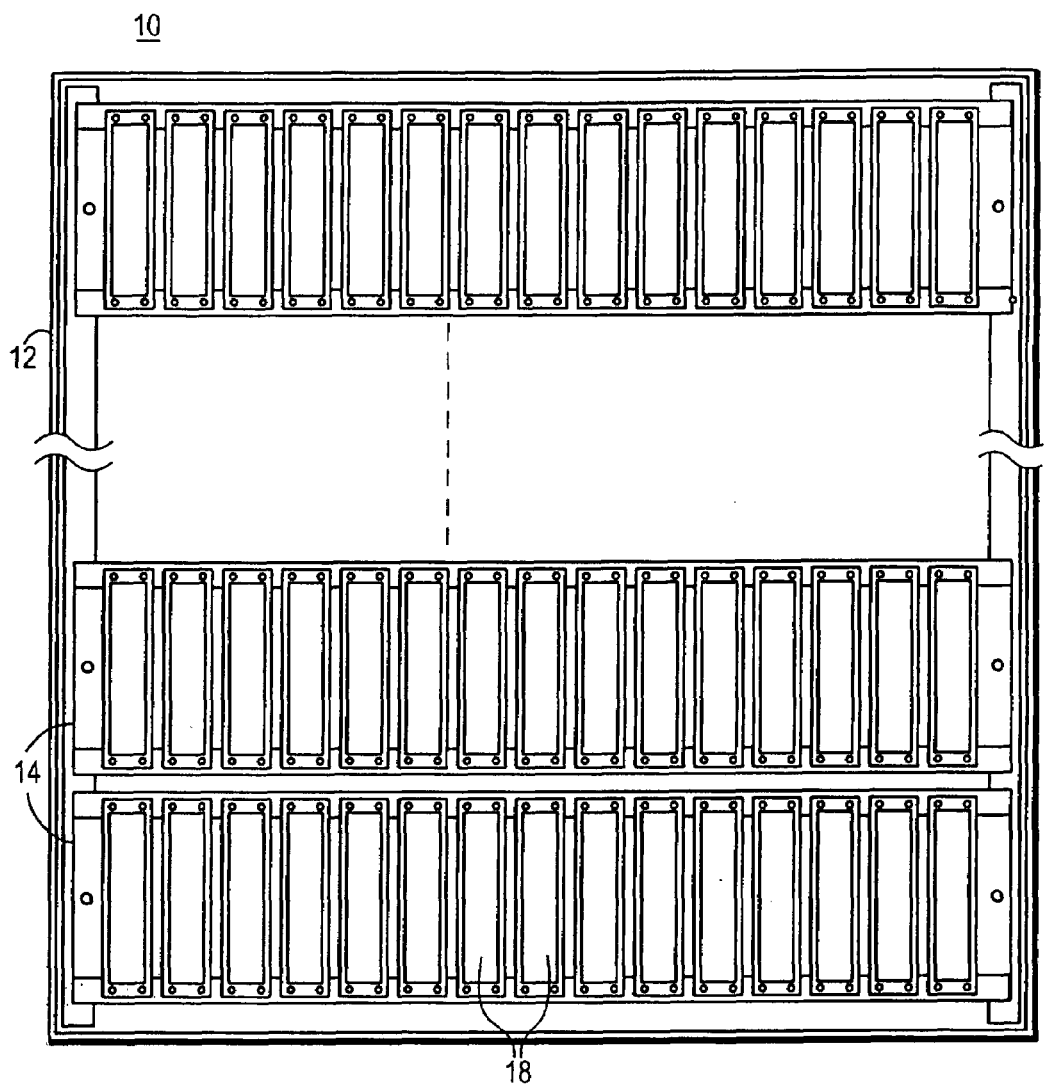
FIG. 1 is a representation of a storage system including several storage enclosures.

Referring to FIG. 1, there is shown an example of a storage system 10 in which the present invention may be employed. A rack mount cabinet 12 includes several storage enclosures 14. In accordance with the principles of the invention, each storage enclosure 14 has installed therein several disk drives 18. Further in accordance with the principles of the invention, the disk drives 18 may be compatible with any low voltage differential signaling (LVDS) storage technology. For example, the disk drives 18 may be 2 Gb Fibre Channel disk drives, or they may be 4 Gb Fibre Channel disk drives, or they may be Serial Advanced Technology Attachment (SATA) disk drives, or they may be Serial Attached SCSI (SAS) disk drives. Though serial channel technologies are preferred, the invention does not preclude the use of parallel technology. A highly flexible storage system architecture is thereby provided, wherein the architecture is independent of storage technology. Thus, as disk sizes decrease, capacities increase, and new storage technologies emerge, the same storage system chassis and architecture can be used with the new disks. Several systems 10 can be cascaded to provide petabytes of storage space. This embodiment is shown by way of example only, as the invention is not limited to any particular number of disk drives, carriers, or enclosures.

The bottom enclosure 14 in FIG. 1 is a storage processor enclosure 20. The storage processor enclosure 20 couples the storage system 10 to either another storage system 10 or a host server. Each storage processor enclosure 20 is preferably an EIA RS-310C 1U standard rack mount unit.

Figure 2:
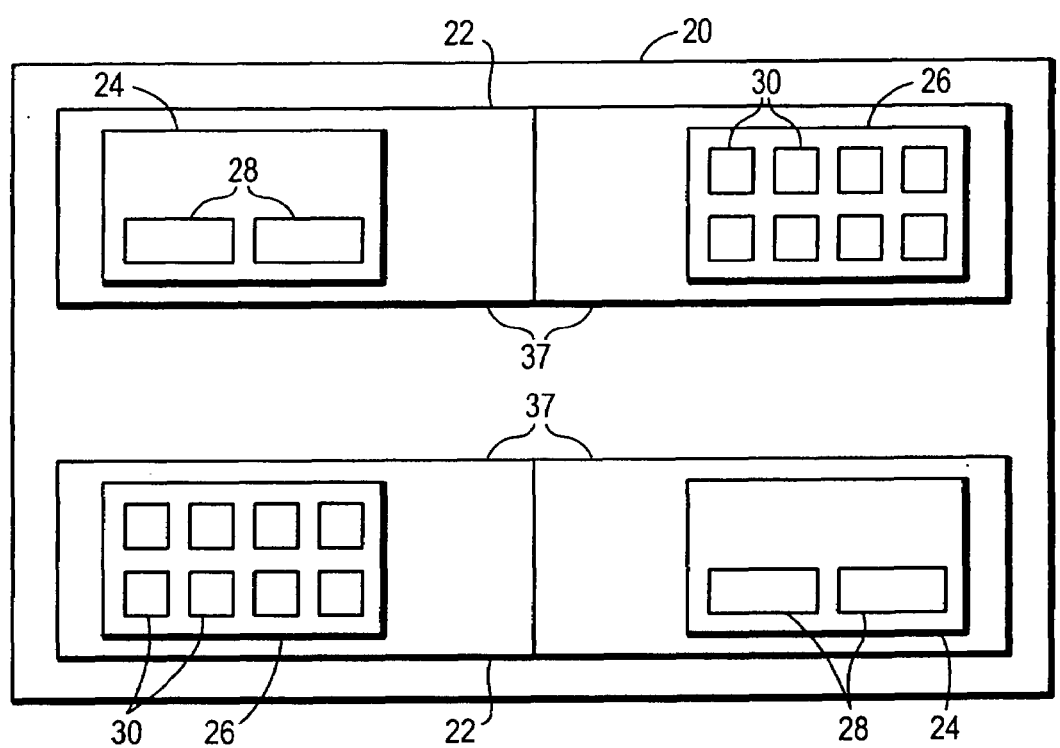
FIG. 2 is a rear view of a storage processor enclosure.

In FIG. 2 there is shown a rear view of the storage processor enclosure 20. The enclosure 20 includes a pair of storage processor units 22. Each storage processor unit 22 includes a host I/O interface 24 and a disk I/O interface 26. As herein shown, the host I/O interface consists of two 10 Gigabit fibrechannel interfaces for connection to a host server via 10 Gigabit small form factor pluggable (XFP) connectors 28. The disk I/O interface consists of eight 2 Gigabit Fibrechannel interfaces for connection to the disk drives via small form pluggable (SFP) connectors 30.

Figure 3:
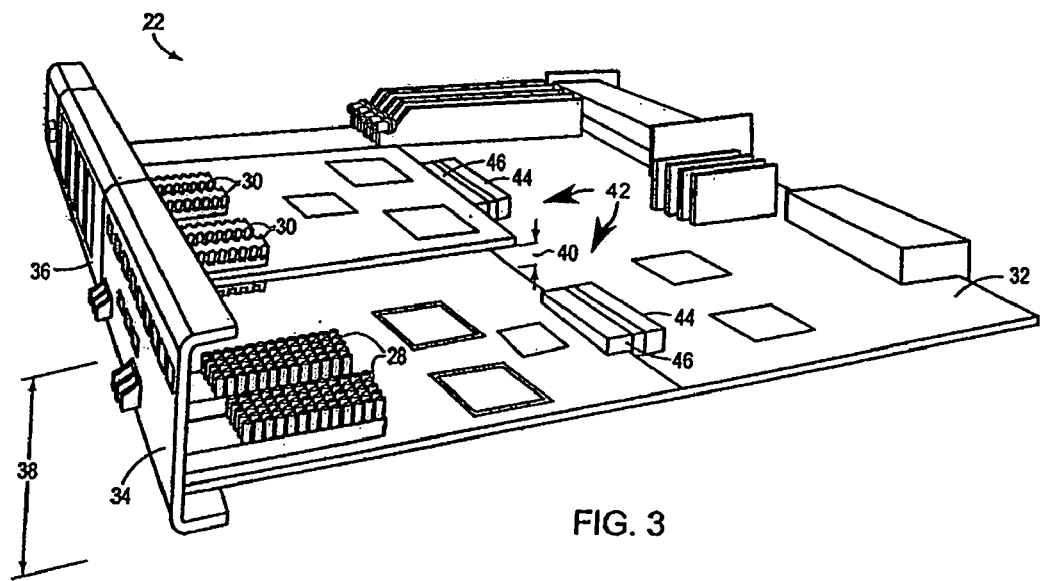
FIG. 3 is a perspective view of the interior of the storage processor enclosure, showing a motherboard and several pluggable I/O modules.

In FIG. 3, one of the storage processor units 22 is shown in the interior of the enclosure 20 to include a motherboard 32 coupled to two pluggable modules 34 and 36. (A second motherboard and set of pluggable modules resides in the chassis but is not shown for purposes of clarity.) The pluggable modules 34 and 36 are insertible through side-by-side slots 37 in the enclosure 20. The XFP connectors 28 reside on the pluggable module 34. The SFP connectors 30 reside on the pluggable module 36. The motherboard 32 and the XFP pluggable module 34 reside laterally in-line relative to the height 38 of the storage processor unit 22. The motherboard 32 and the XFP pluggable module 34 are positioned within the storage processor unit 22 such that there is enough vertical clearance to accommodate the components on the motherboard 32 and the relatively large XFP connector heat sinks on the pluggable module 34. The SFP pluggable module 36 is positioned with a lateral offset 40 relative to the motherboard 32 and the XFP pluggable module 34. This is because, in order to fit eight SFP connectors 30 on the pluggable module 36 in the width available, four are placed on the top of the SFP pluggable module 36 and four are placed on the bottom of the pluggable module 36. The SFP connectors 30 have a smaller height than the XFP connectors 28. So, by positioning the SFP pluggable module closer to the top of the unit 22, vertical clearance is obtained for the SFP connectors 30 on the bottom of the pluggable module 36.

Figure 4A:
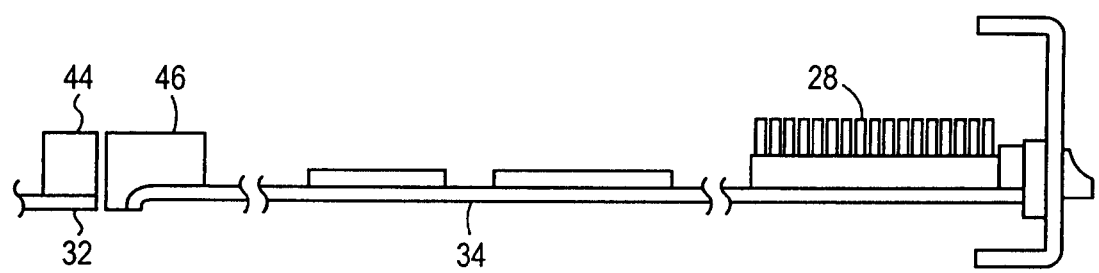
FIG. 4A is a side view of an XFP pluggable module connected to the motherboard.
Figure 4B:
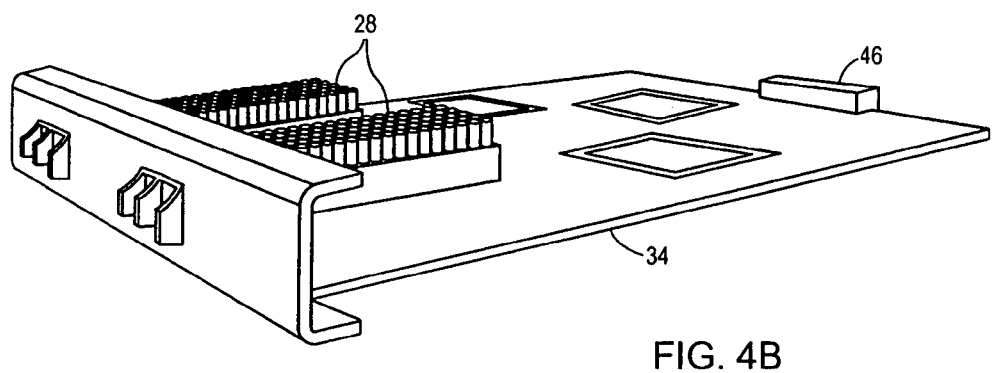
FIG. 4B is a perspective view of an XFP pluggable module.
Figure 5A:
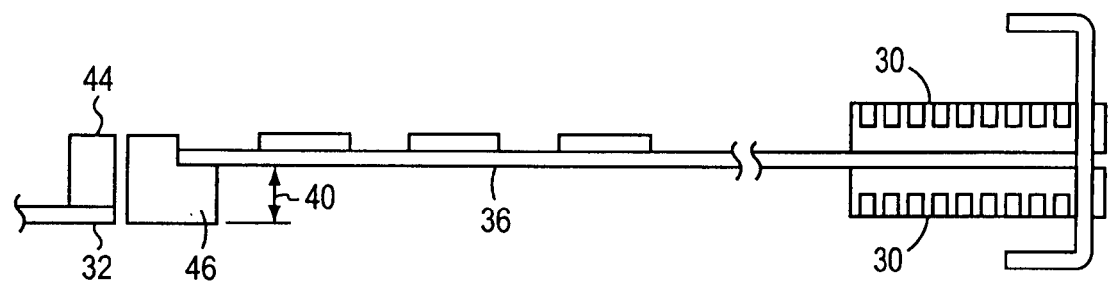
FIG. 5A is a side view of an SFP pluggable module connected to the motherboard.
Figure 5B:
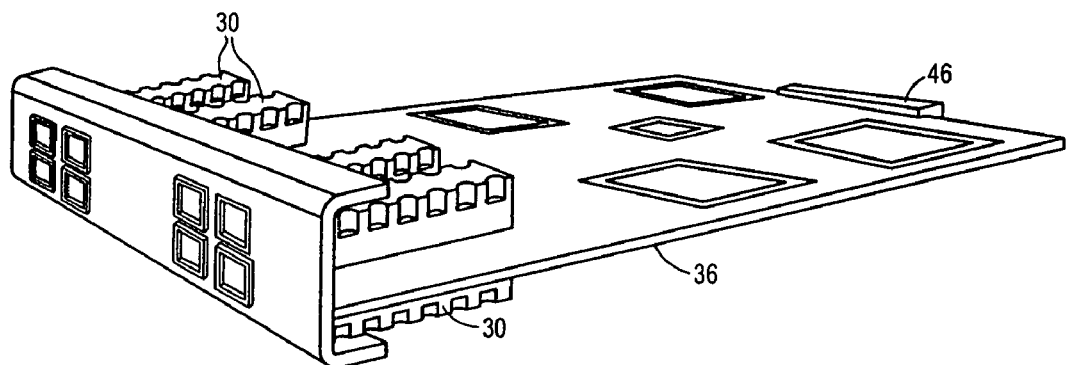
FIG. 5B is a perspective view of an SFP pluggable module.

According to a preferred embodiment, each pluggable module 34 and 36 is coupled to the motherboard 32 via a right-angle connector 42, consisting of a first portion 44 residing on the motherboard, and a second portion 46 residing on each pluggable module 34 and 36. The portions may be either "male" or "female" without departing from the invention. One example of a connector 42 that could be employed is the VHDM connector from Teradyne. Referring to FIGS. 4A and 4B, the portion 46 on the XFP pluggable module 34 is installed such that, when it is joined to the portion 44 on the motherboard, the XFP pluggable module 34 resides in-line with the motherboard. Referring to FIGS. 5A and 5B, the portion 46 on the SFP pluggable module 36 is installed inverted, such that when it is joined to the portion 44 on the motherboard 32, the SFP pluggable module 36 resides at an offset 40 relative to the motherboard 32 and also relative to the XFP pluggable module 34. The portion 46 on the SFP pluggable module 36 thus acts as a "riser" for properly positioning the SFP pluggable module 36 within the enclosure 20. Employing the portion 46 as a riser is highly advantageous in that no midplane is required, and thus multiple connectors are not required. Signal integrity is therefore much improved.

Figure 6:
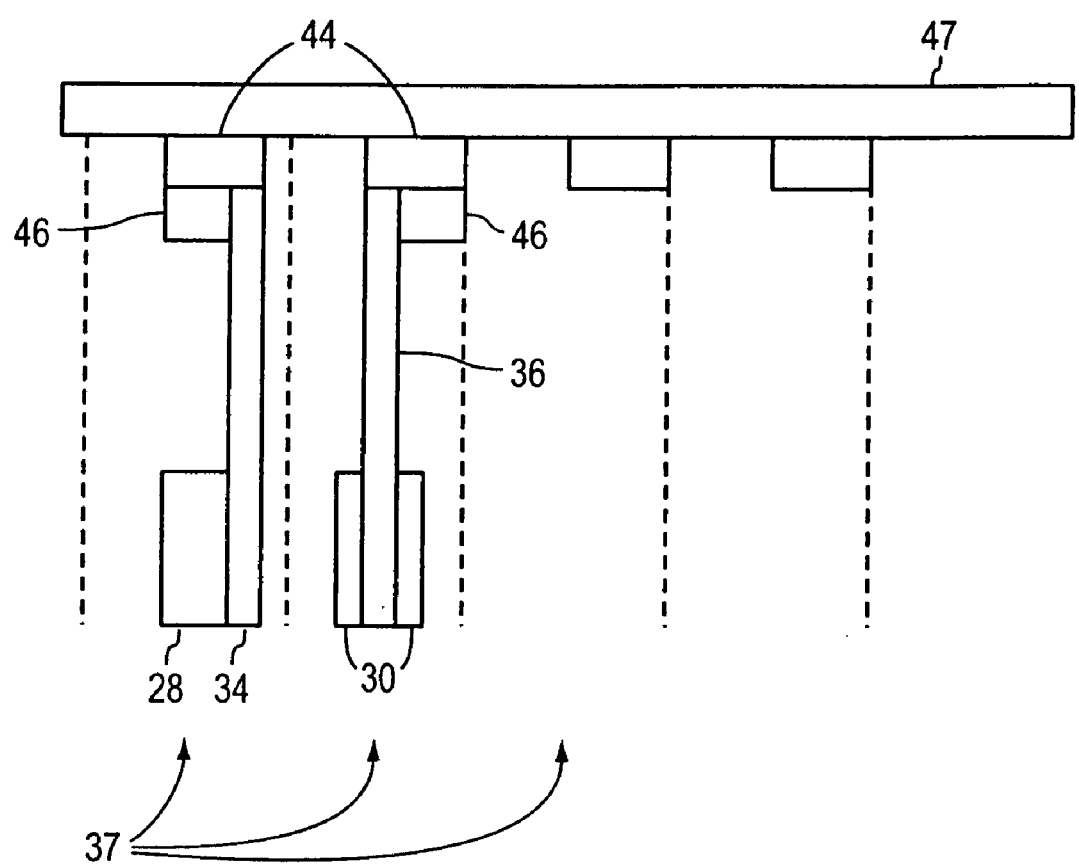
FIG. 6 is an overhead view of an XFP and SFP module plugged into a backplane.

Referring to FIG. 6, the pluggable modules 34 and 36 are shown in a vertical configuration, connected to a backplane 47 via the connectors 42. In this configuration, the connector portions 44 are equally spaced across the backplane 47, but the modules 34 and 36 are positioned within the equally spaced slots 37 depending upon the orientation of the connector portion 46. So, a module with large heat sinks on one side, such as the XFP pluggable module 34, has its connector portion 46 on one side so that it is positioned close to one side of a slot 37. Another module which is designed to maximize component densities, such as the SFP module 36, has its connector portion 46 on the other side relative to the XFP pluggable module so that it is positioned in the center of a slot 37.

In accordance with an aspect of the invention, the connectors 42 are the same part. In other words, the portion 46 on the XFP pluggable module 34 and the SFP pluggable module 36 are the same part but inverted relative to each other. Referring to FIG. 7, there is shown the connector pinout designed such that either pluggable module may be installed in a given slot. The 2 Gb Fibrechannel and 10 Gb Fibrechannel signals consist of low voltage differential signal pairs. On the connector, each signal pair occupies adjacent pins and is surrounded by ground connections for shielding and signal integrity purposes. In FIG. 7, 16 differential signal pairs are shown, and are listed for example as (A0+A0−), (A1+A1−), (B0+B0−) etc. When used on the SFP pluggable module 36, each of the eight SFP connectors 30 passes two differential signal pairs, one for transmit data and one for receive data, thus occupying all the differential signal pair connections on the connector 42. When used on the XFP pluggable module 34, each of the two XFP connectors 28 passes two differential signal pairs, one for transmit and one for receive, using (any) four of the sets of differential signal pair connections on the connector. Note now that, when the connector portion 46 is inverted, the locations of the ground and differential signal pair connections are the same except for the fact that the "A" and "B" signal designations are swapped. The polarities of each differential signal pair are also maintained. So, the connector portion 46 can be used either as the XFP pluggable module portion 46, or inverted for use as the SFP pluggable module portion 46. Thus, the SFP and XFP modules are interchangeable.

Figure 8:
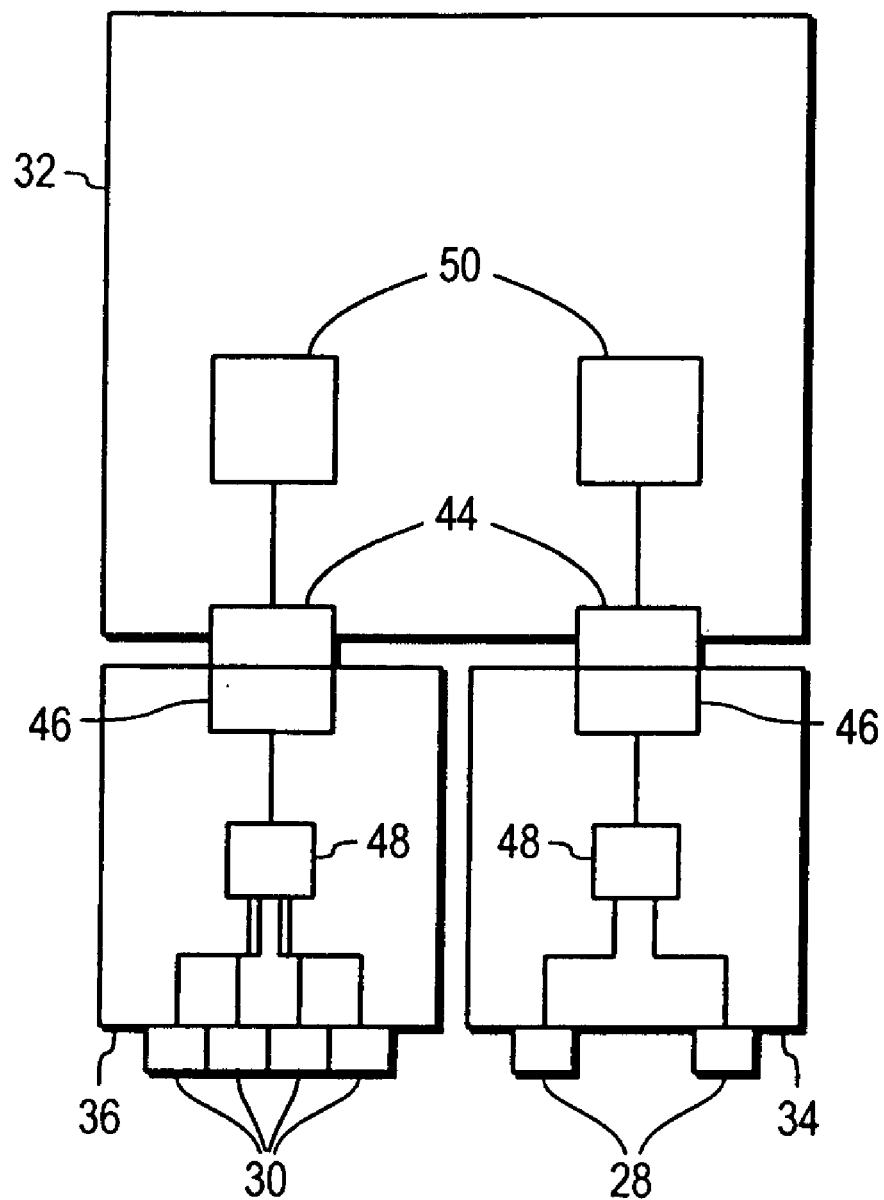
FIG. 8 is a schematic representation of a pluggable module coupled to a chip-to-chip controller on a motherboard via a bridge chip.

In accordance with a particular embodiment as shown in FIG. 8, the signals from the XFP 28 and/or SFP 30 connectors are coupled to the connectors 42 via a bridge chip 48. The bridge chip 48 converts the differential signals, for example the fibre channel signals, to signals compatible with a chip-to-chip protocol—for example PCI Express. The output of the bridge chip 48 is coupled through the connector 42 to a chip-to-chip protocol converter—for example a PCI Express controller 50 on the motherboard 32. In accordance with known PCI Express functionality as described in "PCI Express Base Specification 1.0a", published by PCI-SIG, the PCI Express controller 50 accepts differential pair signals referred to as "lanes". The PCI Express controller 50 is capable of identifying when the lanes connected to it have been swapped. So, in the event that an implementation requires that the "A" and "B" signals must be identified separately, the PCI Express controllers 50 will sense that the "A" and "B" signals have been reversed when the connector portion 46 is inverted and will compensate accordingly. Furthermore, if a connector inversion results in a polarity reversal, the PCI Express controllers 50 can compensate for this as well.

Figures 9A, 9B:
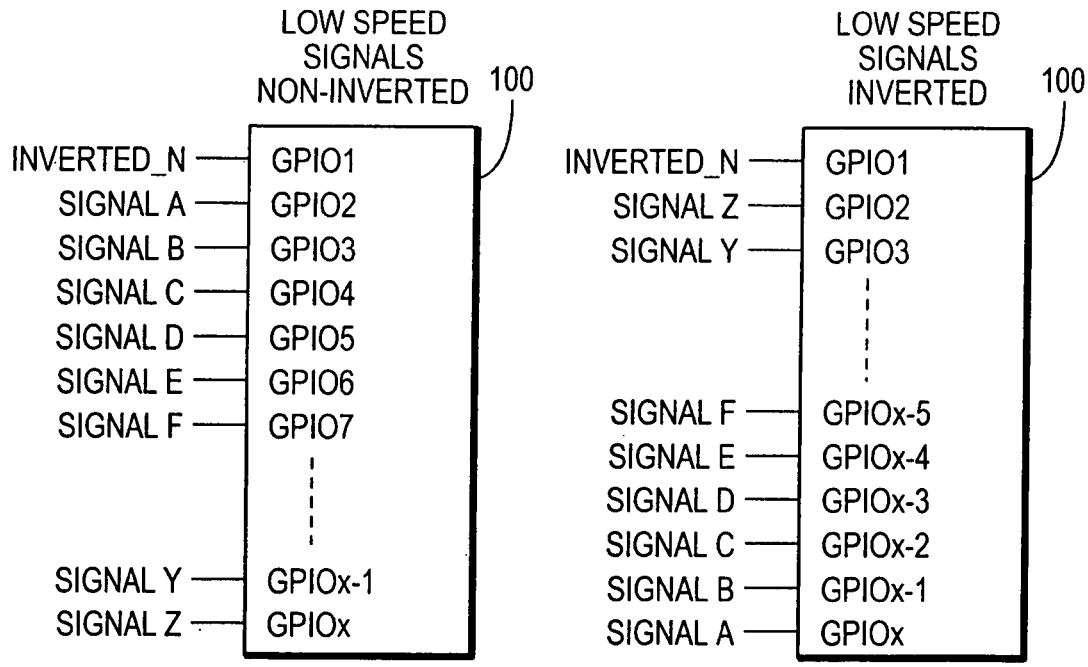
FIGS. 9A and 9B are schematic representations of low speed signaling as recognized by a PLD based on the orientation of a connector.
Figure 10:
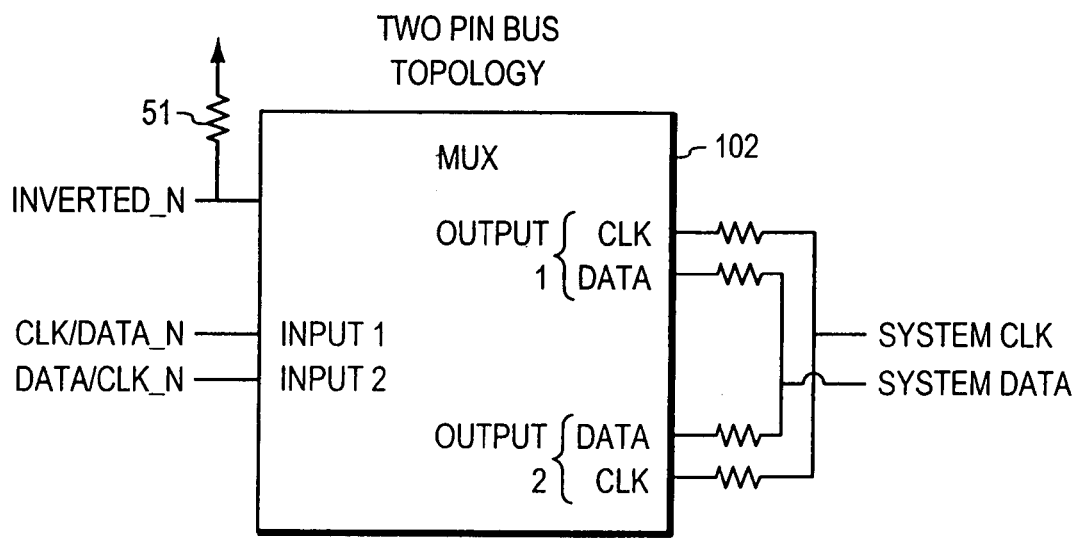
FIG. 10 is a schematic representation of a serial bus multiplexer for driving clock and data lines based on the orientation of a connector.

According to a further aspect of the invention, low speed signals are transmitted through the connectors 46 and 44 in a manner such that the inversion of the modules relative to each other is transparent. Referring to FIG. 7, low speed signals are designated "Signal A", "Signal B", etc., to "Signal Z". When inverted, Signal Z is transmitted on the pin carrying Signal A when inverted, and Signal Y is transmitted on the pin carrying Signal B when uninverted, etc. A signal "IN VERTED N" occupies the top left corner of the connector 46 pinout diagram in FIG. 7. The corresponding connector pin 44 on the motherboard is coupled to a pull-up resistor 51 (FIG. 10). When the connector 46 is plugged into the connector 44 in the non-inverted position (e.g. for the XFP module 34), the INVERTED_N signal on the motherboard 32 is high. When the connector 46 is plugged into the connector 44 in the inverted position, the ground connection GND in the lower right of FIG. 7 pulls the INVERTED_N signal low. So, the INVERTED_N signal can be used by logic on the motherboard 32 to decode which low speed signals are present on which pins on the connector 44. For example, referring to FIG. 9, there may be for example a PLD 100 on the motherboard 32. The low speed signals such as Signal A, Signal B, etc. may be general purpose I/O signals. The PLD 100 receives the low speed signals and the INVERTED_N signal. If the INVERTED_N signal is high, the PLD recognizes the low speed signals as shown in FIG. 9A—Signal A through Signal Z. If the INVERTED_N signal is low, the PLD 100 recognizes the low speed signals as shown in FIG. 9B—Signal Z through Signal A.

Further in accordance with the invention, as shown in FIG. 7, a pair of signals associated with a serial bus are transmitted on the corner pins designated CLK/DATA_N and DATA/CLK_N. The serial bus may be for example an I2C bus. When the connector 46 is not inverted, the upper right pin carries a data signal while the lower left pin carries a clock signal. When the connector 46 is inverted, the upper right pin carries the clock signal and the lower left pin carries the data signal. As shown in FIG. 10, the INVERTED_N signal is used by a multiplexer 102 to discern which pin carries the clock signal and which pin carries the data signal. When the INVERTED_N signal is high, input 1 on the multiplexer 102 is recognized as a data signal and the input 2 on the multiplexer 102 is recognized as a clock signal, and outputs 1 drive the System CLK and System DATA signals. When the INVERTED_N signal is low, input 1 on the multiplexer 102 is recognized as a clock signal and the input 2 on the multiplexer 102 is recognized as a data signal, and outputs 2 drive the System CLK and System DATA signals.

Figure 11A:
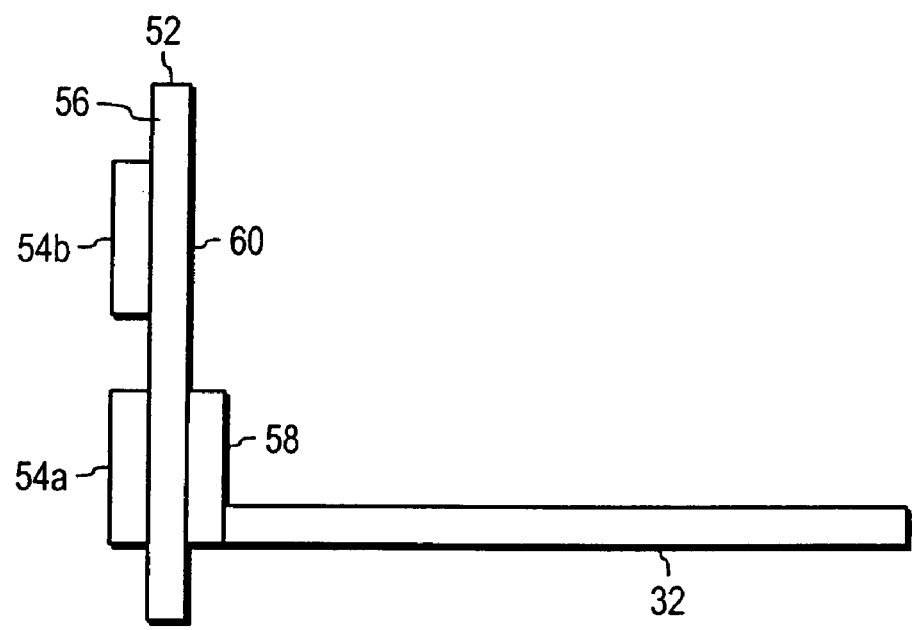
FIGS. 11A and 11B are side and front views respectively of a riser board connected to the motherboard.
Figure 11B:
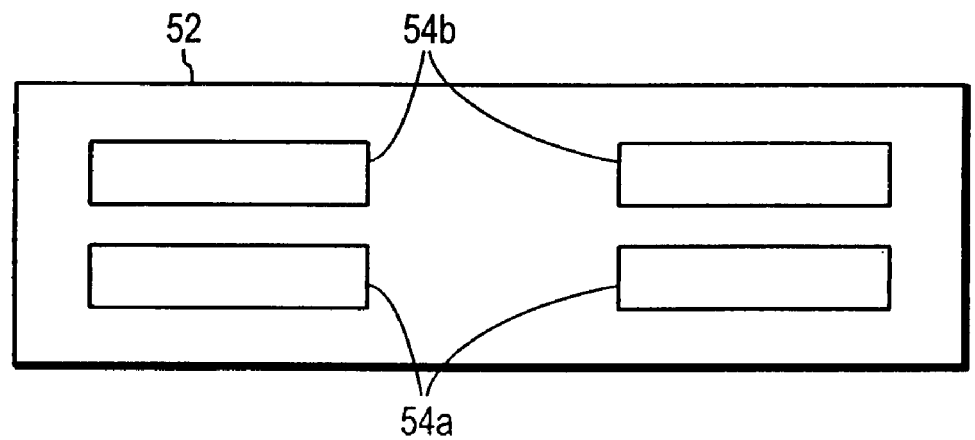
Figure 12:
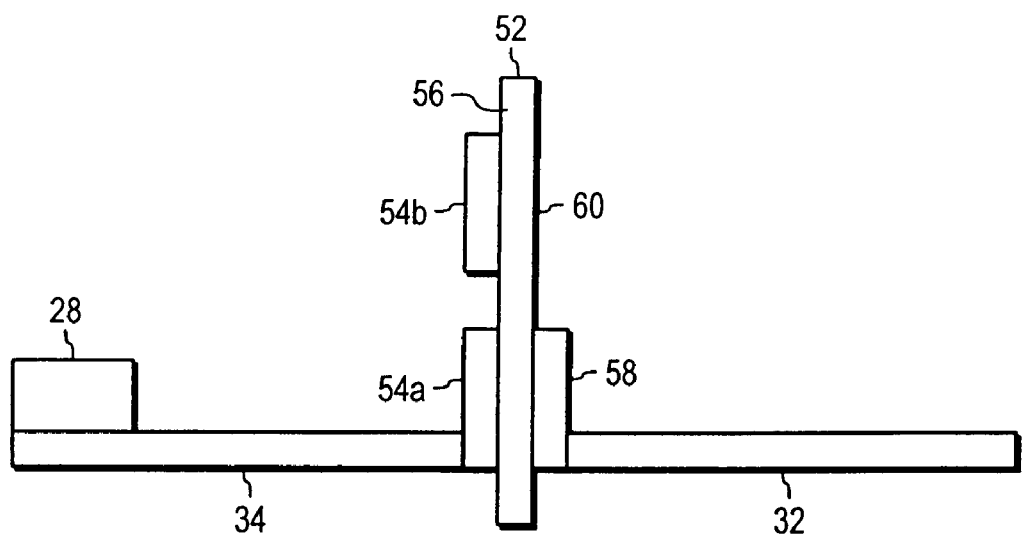
FIG. 12 is a side view of an XFP pluggable module connected to the motherboard through the riser board.
Figure 13:
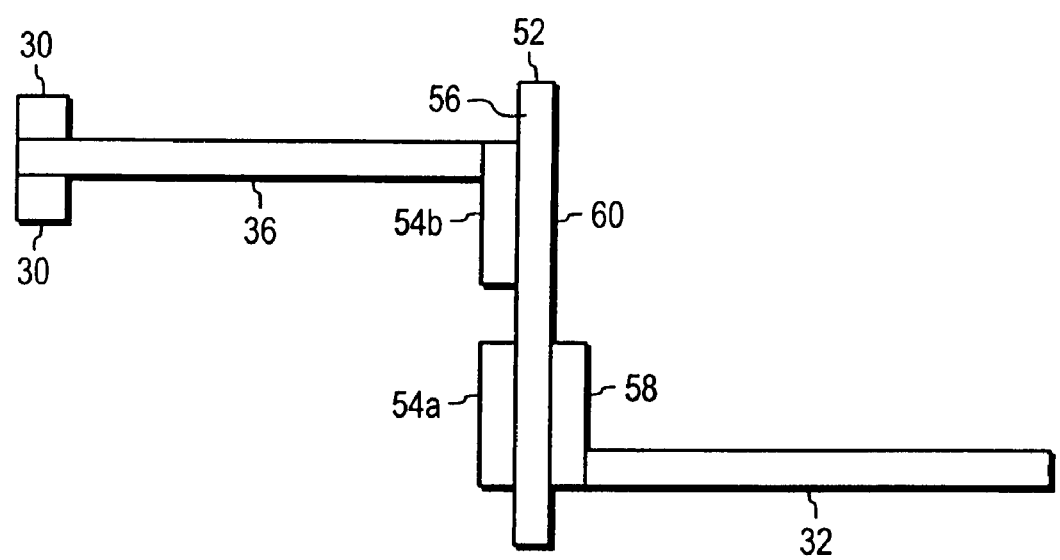
FIG. 13 is a side view of an SFP pluggable module connected to the motherboard through the riser board.

In accordance with an alternate embodiment as shown in FIGS. 11A and 11B, the lateral offset 40 between the SFP pluggable module 36 and the motherboard 32 and XFP pluggable module 34 is provided by a riser board 52. The riser board 52 includes two rows of straight through connectors 54a and 54b on the I/O module side 56 and one row of straight through connectors 58 on the motherboard side 60. The row of straight through connectors 58 on the motherboard side 60 is laterally in-line with the bottom row of straight through connectors 54a on the I/O module side 56. As shown in FIG. 12, when an XFP pluggable module 34 is plugged into the system, it connects through one of the connectors 54a on the bottom row of straight connectors and thus the XFP pluggable module connects in-line with the motherboard 32 and clearance for the XFP connectors 28 is maintained. As shown in FIG. 13, when an SFP pluggable module 36 is plugged into the system, it connects through one of the connectors 54b on the top row of straight connectors and then through the connector 58 on the bottom row. Thus the SFP pluggable module 36 is offset from the motherboard 32 and clearance is maintained for the SFP connectors 30 on both sides of the SFP pluggable module 36.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the invention. Further, although aspects of the present invention have been described herein in the context of a particular implementation in a particular environment for a particular purpose, those of ordinary skill in the art will recognize that its usefulness is not limited thereto and that the present invention can be beneficially implemented in any number of environments for any number of purposes. For example, though the invention has been described in terms of SFP and XFP connectors, it is clear that any type of connector can be accommodated. Furthermore, though the invention has been described as it applies to a storage system, it can clearly be employed in any system environment where pluggable modules need to be installed at different lateral offsets relative to a motherboard or to each other.

We claim:

1. A method comprising the steps of:
coupling a first pluggable module to a circuit board via a first connector, the circuit board residing in an enclosure having side-by-side slots thereon for inserting pluggable modules therethrough for coupling to the circuit board, such that when the first pluggable module is coupled to the circuit board through one of the side-by-side slots, it resides side-by-side but laterally offset from a second pluggable module coupled to the circuit board through another of the side-by-side slots, wherein the second pluggable module is coupled the circuit board via a second connector, and wherein the first and second connectors are right angle connectors, and wherein the step of coupling the first pluggable module to the circuit board includes the step of coupling the first pluggable module to the circuit board via a first right angle connector such that the first right angle connector is inverted relative to the second right angle connector, and wherein the first and second pluggable modules are input/output (I/O) modules for transporting high speed differential signals, and wherein the first pluggable module includes a first number of connectors of a first size, and wherein the second pluggable module includes a second number of connectors of a second size, and wherein the first number is less than the second number, and wherein the first size is larger than the second size.

2. The method of claim 1, wherein the second number of connectors are small form pluggable (SFP) connectors arranged on both sides of the second pluggable module.

3. The method of claim 1, wherein the first number of connectors are 10 Gigabit small form factor pluggable (XFP) connectors arranged on one side of the first pluggable module.

4. The method of claim 1, wherein the second pluggable module is a small form pluggable (SFP) module which is constructed and arranged to communicate with the circuit board through the second connector.

5. The method of claim 1, wherein the first pluggable module is a 10 Gigabit small form factor pluggable (XFP) module which is constructed and arranged to communicate with the circuit board through the first connector.

* * * * *